United States Patent [19]

Lin

[11] 4,301,592
[45] Nov. 24, 1981

[54] METHOD OF FABRICATING SEMICONDUCTOR JUNCTION DEVICE EMPLOYING SEPARATE METALLIZATION

[76] Inventor: Hung Chang Lin, 8 Schindler Ct., Silver Spring, Md. 20903

[21] Appl. No.: 113,574

[22] Filed: Jan. 21, 1980

Related U.S. Application Data

[62] Division of Ser. No. 909,933, May 26, 1978, abandoned.

[51] Int. Cl.³ ............................................. H01L 31/18
[52] U.S. Cl. .......................................... 29/590; 29/572; 136/256; 136/261; 357/30; 357/65; 427/88; 427/90
[58] Field of Search .................. 29/572, 590; 136/256, 136/261; 357/30, 65; 427/88–90

[56] References Cited

U.S. PATENT DOCUMENTS 3,434,885 3/1969 Mandelkorn et al. .............. 136/256
3,736,180 5/1973 Fischer et al. ........................ 427/74

OTHER PUBLICATIONS

H. J. Hovel, "Semiconductors and Semimetals—Vol. 11—Solar Cells", Academic Press (1975), pp. 209–210.

*Primary Examiner*—Aaron Weisstuch

[57] ABSTRACT

A method of fabricating a p−n junction device such as solar cells using metal contacts for p regions and n region heat-treated at two different temperatures. A metal with low work functions is heated first to a high temeperature for making ohmic contact to a p-type semiconductor substrate, and then at low temperature for contacting the n-type region. A metal with high work function is heated first to a high temperature for contacting an n-type semiconductor substrate and then at low temperature for contacting the p-type region.

5 Claims, 4 Drawing Figures

METHOD OF FABRICATING SEMICONDUCTOR JUNCTION DEVICE EMPLOYING SEPARATE METALLIZATION

This application is a division of Application Ser. No. 909,933 filed May 26, 1978, abandoned.

BACKGROUND OF THE INVENTION

The present invention is related to semiconductor devices and, in particular, to solar cells.

A conventional semiconductor solar cell is made of a p—n junction. One side of the junction is usually very shallow to allow photons to be penetrated to the junction area. The photons break up the semiconductor atoms into holes and electrons, which cross the junction and flow as load current. For the current to flow into the load, ohmic contacts must be made to both the p-region and the n-region.

In the semiconductor art, ohmic contacts are usually made by allowing a metal to the semiconductor at or slightly below the eutectic temperature. This alloying process is also known as sintering. In the sintering process, the metal penetrates into the semiconductor to form an alloy. If the one side of the junction is very thin as is typically the case for a solar cell, contacting metal for the thin layer may penetrate through the layer and cause a short circuit between the metal and the other underlying side of the junction. If no high temperature sintering is used, the contact may not be ohmic, and the series resistance can be very high.

With the advent of ion-implantation, the problem is particularly severe. For a diffused junction, the junction depth is typically in the 1 micrometer range. For an implanted junction, the range is typically a tenth of a micrometer or less. An ion-implanted layer offers a number of advantages such as improved blue spectrum response, better lifetime due to low temperature processing, low energy consumption, better control of doping, etc. To realize these advantages, one must be able to make an ohmic contact to the thin ion-implanted layer.

SUMMARY OF THE INVENTION

An object of the invention is to make ohmic contact to a semiconductor device, having a thin junction, such as a solar cell. Another object of the invention is to make ohmic contact to a semiconductor device which has a thin layer of insulating material on the surface. A further object of this invention is to make ohmic contact to semiconductor devices with a thin ion-implanted layer. Still another object of the invention is to make ohmic contact to semiconductors at low temperatures.

The above objects are achieved in the present invention by using different temperatures and/or materials for contacting different conductivity type semiconductor. With proper choice of conditions, the metal can make ohmic contact in spite of the presence of a thin layer of oxide on the semiconductor surface. The details of the method and the device fabricated thereby are set forth in the description of the drawings.

DETAILED DESCRIPTION OF THE PREFERRED EMBODIMENT

Figure 1:
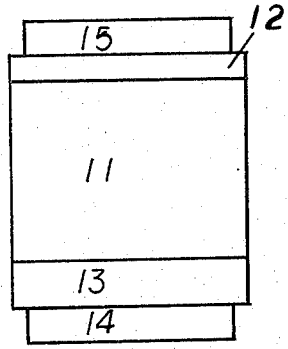
FIG. 1 is a cross section of a semiconductor junction device in accordance with the present invention.

Referring to the drawings, FIG. 1 is a schematic cross section of a semiconductor device, such as a solar cell, fabricated by the method of the present invention. The device comprises a semiconductor substrate 11, e.g., silicon, doped to exhibit a p-type or n-type conductivity. By way of example, a p-type substrate is adopted here for description. A thin layer 12 of opposite conductivity type to that of the substrate is formed on top of the substrate 11, by well-known semiconductor process such as diffusion or ion-implantation. As a solar cell, a heavily doped layer 13 of same conductivity type as substrate 11 is usually deposited on the backside of the substrate to provide a favorable back electric field to enhance the solar cell characteristic as is well-known in the art.

Then, the structure is metalized for making ohmic contacts 14 and 15 to the p- and n-type regions respectively. In the conventional process, the metals for contacting the p-n junction structure are usually of the same material and heated simultaneously to form a eutectic bond. If the temperature is high, a good ohmic contact can be obtained between the backside of silicon layer 13 and the metal 14. However, high temperature causes the metal to penetrate into the semiconductor. For the thin semiconductor layer 12 high temperature metallization can cause the metal 15 to penetrate through this layer and result in a short-circuit between the metal and the substrate.

On the other hand, if the metallization temperature is too low, the contact may not be ohmic, or may have a high resistance. Such a poor contact can be due to the presence of a thin layer of natural oxide on the semiconductor surface, or due to the work function difference between the metal and the semiconductor creating a potential barrier.

According to this invention, high temperature sintering is performed for the contact 14 to the p type substrate 11 but not the n+ layer 12. This can be accomplished with a two-step process for fabricating the structure shown in FIG. 1. First, aluminum 14 is deposited on the p-type silicon and sintered to a temperature typically from 400° C. to 800° C. in an non-oxidizing atmosphere. Thus, an ohmic contact is made to the p-type region. Afterwards, another aluminum layer 15 is deposited over the n+ region 12, but sintered at a lower temperature less than 400° C. or not sintered at all. Then, ohmic contact 15 between aluminum and the n+ layer 15 can be obtained even if there is a thin interfacial oxide.

When a metal is deposited on semiconductor without heat treatment, the contact can be ohmic or rectifying depending upon the work function difference and the surface states. When the contact is rectifying, it is a Schottky barrier. An ohmic contact should not be a Schottky barrier.

Consider the ideal case when there are no surface states. If the silicon substrate is p-type and the metal work function is less than the semiconductor work function, such as aluminum on p-type silicon, electrons would spill over from the metal to the semiconductor upon contact, depleting the holes near the silicon surface and creating a potential barrier $\phi_{bp}$ as shown in the energy band diagram in FIG. 2. Such a contact is a rectifying and forms a Schottky barrier. Most metals for contacting semiconductors such as aluminum, have work functions below 4.1 eV. The work function of a p-type semiconductor is equal to $q\phi_s \times q(V_g/2 + \chi + V_p)$, where $V_g$ is the energy gap, $\chi$ is the electron affinity and $V_p$ is the quasi-Fermi potential of the p-type semiconductor. For silicon with $V_g = 1.11$ eV and $\chi = 4.0$ eV, the work function is generally larger than that of aluminum. Hence, the contact is nonohmic.

Figure 3:
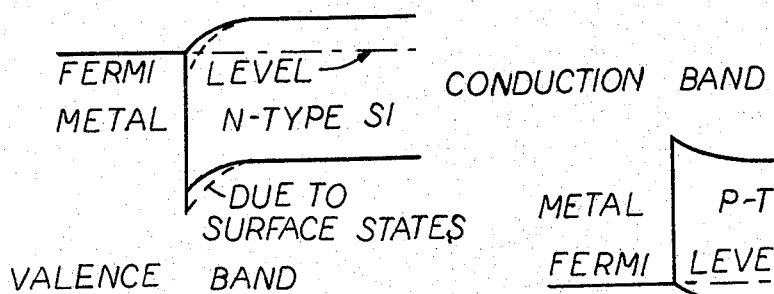
FIG. 3 is an energy band diagram showing the potential energy of a metal of lower work function in contact with an n-type semiconductor of comparable work function, such as aluminum on n+ type silicon.

When a semiconductor is n-type, the contact should be ohmic if the metal work function is less than the semiconductor work function because the electrons spilled over from the metal to the semiconductor makes the n-type semiconductor more accumulative. If the n-type semiconductor is heavily doped, the Fermi level is near the conduction band edge and the semiconductor work function is nearly the same as the electron affinity. For aluminum, with the work function nearly equal to or less than the electron affinity, the conduction bands are in direct communication as shown in FIG. 3, i.e. the electrons in both materials have nearly the same energy. Then, the electrons can tunnel from the semiconductor to the metal freely as currents. The contact is ohmic.

If there are surface states present at the surface of the semiconductor there is band-bending. In practical surfaces, the (acceptor) surface states often make the surface of n-type silicon accumulative and vice versa for p-type silicon. If, by virtue of the comparable work function of the aluminum and the n+-type silicon, the metal is already making an ohmic contact to the n+ silicon, the effect of the surface states is to make the surface even more accumulative and to bend the energy band downwardly at the semiconductor surface as shown in FIG. 3. In all likelihood, the conduction bands of the metal and the n+ type Si become more aligned, and, hence, more cummunicative to electrons. Then, the contact remains ohmic.

Figure 2:
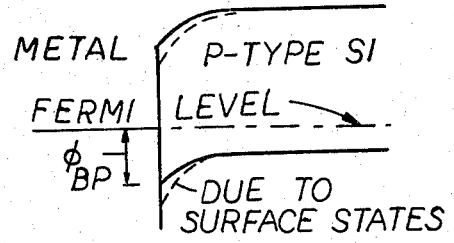
FIG. 2 is an energy band diagram showing the poential energy of a metal of low work function in contact with a p-type semiconductor of higher work function such as aluminum on p-type silicon.

For p-type substrates, if the contact was rectifying in the absence of surface states due to smaller aluminum work function than the p-type silicon work function, then the presence of surface states serves to bend the band downward as shown in FIG. 2. The barrier height is increased and the contact is more rectifying.

When a layer of thin oxide is present between the metal and the semiconductor, the oxide usually contains positive charges. This positive charge induces negative (acceptor) surface states in the semiconductor. The effect of negative surface states was discussed in the preceding paragraph. For thin oxide of less than 20 A in thickness, the layer is transparent to electrons as is well known in the art. Thus, the presence of such a thin layer does not change the rectifying or ohmic nature of an aluminum contact to heavily-doped n-type silicon.

For metal-semiconductor contacts, heat treatment has a drastic effect. When aluminum is deposited on silicon and heated close to the eutectic temperature (577° C.), alloying takes place. The heat creates a regrown layer in the semiconductor which is continuous with the semiconductor. The thickness of this layer is a function of the thickness and temperature of the metal deposition. This metallurgical change yields an ohmic contact between the regrown p-type region and the aluminum, which is a p-type dopant.

When aluminum is alloyed into n-type silicon, an alloyed junction is formed and is rectifying. However, when aluminum is alloyed into a heavily doped n+ background, the junction thus formed is a tunnel diode, which has an ohmic characteristic at the origin of the V-I characteristic.

From the foregoing discussion, it can be seen that aluminum must be sintered in order to make ohmic contact to both p-types, but not n+type silicon. However, in many semiconductor devices, particularly those using ion-implantation, the n+ layer can be very thin, typically in the order of few thousand angstroms. For instance, a thin n+ layer is considered desirable for the n+p type solar cells. If the metallizations of the p type and n+type regions are heat treated simultaneously, such a thin n+ layer can easily be penetrated through during the sintering process and a short-circuit may develop. With my two step metallization and heat treatment, the penetration problem is eliminated.

Although the description relates to an aluminum-silicon system, the principle applies to other systems also. The principle is to use a metal with low work function for contacting an n+ region. The work function of the metal should be nearly the same as the work function of the heavily doped n+-type silicon. Then the electrons can communicate freely or tunnel through a thin oxide from one conduction band to the other conduction band. Thus metals of similar low work function such as titanium, silver, copper, etc., with respective work functions of 4.0 eV, 4.3 eV, 4.24 eV respectively, are suitable for contacting the n+ type silicon region, which has a work function of 4.0 eV.

Figure 4:
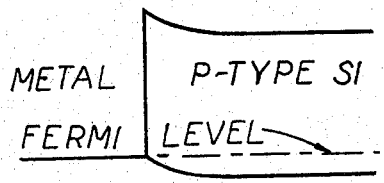
FIG. 4 is an energy band diagram showing the potential energy of a metal of high work function in contact with a p-type semiconductor of lower work function, such as gold on p-type silicon.

On the other hand, for heavily doped p+ type silicon such as a diffused or ion-implanted layer, a large work function metal is required to make an ohmic contact without sintering to the p+ layer. In this case, the electrons from the semiconductor spill over to the metal, making the p-type semiconductor surface more accumulative. The duality of the energy band diagram is shown in FIG. 4. The holes in the valence band of the semiconductor can communicate with that of the metal. Good ohmic contact is established. Metals with high work function such as gold, platinum, palladium, etc., are suitable. For a gold-silicon system, the eutectic temperature is 370° C. A sintering temperature between 350° C. to 400° C. can be used to make ohmic contact to the n-type substrate, but a temperature lower than 350° C. can be used to contact the diffused or ion-implanted p+ layer.

If a low work function metal such as aluminum is used on a p-type semiconductor, electrons from the metal spill over to the p-type semiconductor, causing a depletion of holes at the surface. Then the contact is no longer ohmic. Thus a p+ semiconductor needs a high work-function metal for contact, if sintering is to be avoided.

The application of the foregoing principle using the same metal for both contacts can be summarized in the following table:

| Contact metal | Substrate | First Heat Treatment Temperature | Thin layer (Diffused or ion-implanted) | Second Heat Treatment |
|---|---|---|---|---|
| Low work function | p | high | $n^+$ | low or none |
| High work function | n | high | $p^+$ | low or none |

I claim:

1. A method of contacting a semiconductor junction device comprising the steps of forming a pn or an np junction on a doped semiconductor substrate of one conductivity type by creating a thin layer of opposite conductivity type on said substrate, depositing a layer of a metal on said substrate, heating said substrate and said metal at first temperature to form an ohmic contact, depositing a layer of the same metal on said thin layer of opposite conductivity type, heating said substrate and said metal to a second temperature which is lower than said first temperature, said second temperature being sufficient to form an ohmic contact between said metal and said thin layer but insufficient to form an ohmic contact between said metal and said substrate.

2. A method of contacting a semiconductor junction device as defined in claim 1, wherein said substrate is n-type and said metal is of higher work function than said substrate.

3. A method of contacting a semiconductor junction device as defined in claim 2, wherein said metal is aluminum.

4. A method of contacting a semiconductor junction device as defined in claim 3, wherein said first temperature is higher than 400 degrees centigrade and said second temperature is less than 400 degrees centigrade.

5. A method of contacting a semiconductor junction device as defined in claim 1, wherein said substrate is p-type and said metal is of lower work function than said substrate.

* * * * *